(12) United States Patent
Bogan et al.

(10) Patent No.: US 11,401,632 B2
(45) Date of Patent: Aug. 2, 2022

(54) ELECTRONIC FUNCTIONALITY IN TEXTILES

(71) Applicant: Microsoft Technology Licensing, LLC, Redmond, WA (US)

(72) Inventors: Kelly Marie Bogan, Redmond, WA (US); James David Holbery, Bellevue, WA (US); Siyuan Ma, Bothell, WA (US); Benjamin Sullivan, Seattle, WA (US); Don Pasindu Vijai Lugoda, Colombo (LK)

(73) Assignee: Microsoft Technology Licensing, LLC, Redmond, WA (US)

( * ) Notice: Subject to any disclaimer, the term of this patent is extended or adjusted under 35 U.S.C. 154(b) by 767 days.

(21) Appl. No.: 15/890,116

(22) Filed: Feb. 6, 2018

(65) Prior Publication Data
US 2019/0242036 A1    Aug. 8, 2019

(51) Int. Cl.
| | |
|---|---|
| *H05K 1/03* | (2006.01) |
| *H05K 3/02* | (2006.01) |
| *D04B 1/12* | (2006.01) |
| *D03D 1/00* | (2006.01) |
| *B32B 5/26* | (2006.01) |
| *B32B 27/02* | (2006.01) |
| *B32B 7/02* | (2019.01) |

(52) U.S. Cl.
CPC ............ *D03D 1/0088* (2013.01); *B32B 5/26* (2013.01); *B32B 7/02* (2013.01); *B32B 27/02* (2013.01); *D04B 1/12* (2013.01); *H05K 1/038* (2013.01); *H05K 3/02* (2013.01); *D10B 2401/16* (2013.01); *D10B 2403/02431* (2013.01); *H05K 2201/029* (2013.01); *H05K 2201/0281* (2013.01)

(58) Field of Classification Search
CPC ........................................................ D04B 1/12
See application file for complete search history.

(56) References Cited

U.S. PATENT DOCUMENTS

| | | | |
|---|---|---|---|
| 7,707,857 B1 * | 5/2010 | McMurray ............. | D04B 1/104 66/196 |
| 8,022,307 B2 | 9/2011 | Chu et al. | |

(Continued)

FOREIGN PATENT DOCUMENTS

WO      2016130888 A1    8/2016

OTHER PUBLICATIONS

"Chip Encapsulation", Retrieved From <<https://web.archive.org/web/20150623095757/https:/www.panacol.com/adhesive-applications/smart-card/chip-encapsulation/>>, Jun. 23, 2015, 3 Pages.

(Continued)

*Primary Examiner* — Jenna L Johnson
(74) *Attorney, Agent, or Firm* — Alleman Hall Creasman & Tuttle LLP

(57) ABSTRACT

Examples are disclosed herein that relate to electronically functional textile articles. One example provides a knitted textile article comprising a first conductive thread and a second conductive thread knit into the article in such a manner as to form a conductive junction separated by a gap. The knitted textile article further comprises a knitted surface texture feature formed at a location that defines an opening over the gap, and an electronic component connecting the gap to form a circuit with the first conductive thread and the second conductive thread.

14 Claims, 6 Drawing Sheets

(56) References Cited

U.S. PATENT DOCUMENTS

| | | |
|---|---|---|
| 9,449,942 B1 | 9/2016 | Liu et al. |
| 2006/0035554 A1 | 2/2006 | Glaser et al. |
| 2008/0196783 A1* | 8/2008 | Van Bruggen ....... D03D 1/0088 |
| | | 139/319 |
| 2008/0245786 A1 | 10/2008 | Sharma |
| 2016/0320037 A1* | 11/2016 | Wong ..................... H05K 1/038 |

OTHER PUBLICATIONS

Zysset, et al., "Textile integrated sensors and actuators for near-infrared spectroscopy", In Proceedings of Optics Express, vol. 21, Issue 3, Feb. 2013, 13 Pages.

Zysset, et al., "Flexible Electronics for Smart Textiles". Wearable Computing Lab, Institute for Electronics, Swiss Federal Institute of Technology Zurich. 2009. 1 Page.

* cited by examiner

ELECTRONIC FUNCTIONALITY IN TEXTILES

BACKGROUND

Electronic circuits may be formed in various manners. For example, some electronic circuits are formed by printing or patterning conductors onto substrates and then adding components to the substrates.

SUMMARY

Examples are disclosed herein that relate to electronically functional textile articles. One example provides a knitted textile article comprising a first conductive thread and a second conductive thread knit into the article in such a manner as to form a conductive junction separated by a gap. The knitted textile article further comprises a knitted surface texture feature formed at a location that defines an opening over the gap, and an electronic component connecting the gap to form a circuit with the first conductive thread and the second conductive thread.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Electronic circuits may be incorporated into a fabric article, for example as an electronically active soft-touch outer layer of a computing device. Electronics may be incorporated into a fabric article in various manners. As one example, conductive lines may be printed onto a fabric article using conductive inks, and components may be mounted to the conductors. However, such conductors, and the connections to the components, may be prone to breakage as the fabric article is handled. It may also be challenging to print conductive ink onto fabric, as potential ink permeation may result in discontinuous or defective conductive traces. Additionally, a separate process step from weaving or knitting the fabric must be used to deposit the conductors. Further, the printed conductors may be visible on the surface of the textile unless covered with another layer of fabric, or some other cover material.

Accordingly, examples are disclosed herein that relate to knitted textile articles that include conductive threads knit in such a pattern as to form conductive junctions. Surface texture features, such as a pointelle, may be knit into the fabric over the junctions in a same knitting process that forms the junctions. Electronic components may be bonded, e.g. via soldering or conductive adhesive, to the conductive junctions to form circuitry by placing the components into the pointelles, e.g. using pick-and-place machinery. In this manner, both the circuitry for the components and pointelles or other openings for accessing electronic junctions are integrated into the fabric item during knitting of the fabric item. The circuitry in the resulting knitted textile article may be hidden and/or protected by an outer knit layer, while the openings allow electronic components to be mounted to the conductors after knitting has been completed. Further, the conductive threads may be knit into patterns that allow each bonded electronic component to be individually addressable. Also, an entire knitted textile article, including the pattern of conductive threads, may be formed in one knitting pass, without requiring assembly of separately formed parts.

Figure 1A:
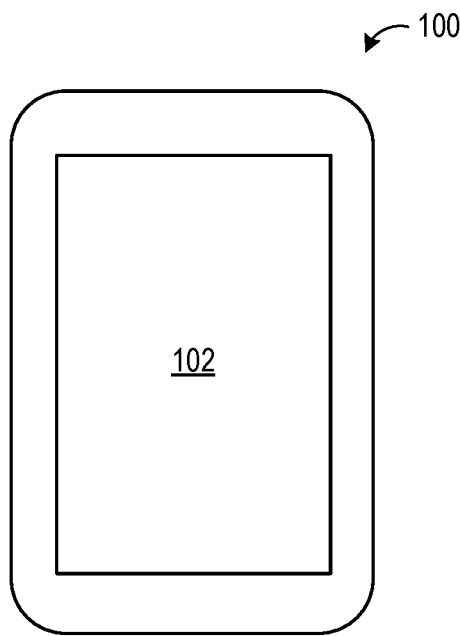
FIGS. 1A and 1B show an example computing device comprising a knitted textile article having pointelles positioned over electronic components.
Figure 1B:
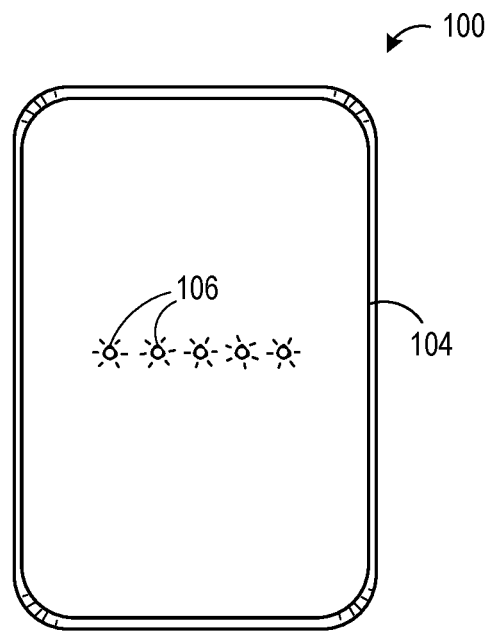

FIGS. 1A and 1B illustrate an example of a computing device 100 in the form of a tablet computing device. FIG. 1A shows a front view of the computing device 100, which includes a display 102, and FIG. 1B shows a back view. Various surfaces of the computing device 100, such as a back surface 104, may be formed from a fabric material. The fabric surface 104 may be formed from a knitted textile having a plurality of knitted surface texture features 106 that form openings within an outer layer of the knitted textile article. The surface texture features 106 may be located over areas at which conductive threads knitted in an inner layer are in sufficiently close proximity to form a junction. Each conductive junction may be connectable or connected by an electronic component placed in a surface texture feature 106 in an appropriate orientation to align connectors on the component with respective conductors in the fabric. In this manner, the electronic components incorporated within the fabric may be visible or otherwise accessible through the fabric openings. Where the components are light-emitting diodes, for example, emitted light can escape through the openings. The term "layer" as used herein does not signify that the knitted textile article is made from an assembly or lamination of two separately formed layers of fabric. Rather, a knitted textile article may include different fabric layers (as distinguished by relative location in an overall thickness of the fabric) that are knit together as a whole fabric structure in a same knitting process. The term "outer layer" as used herein refers to a layer having a surface texture feature through which an electronic component may be placed, and the term "inner layer" refers to a layer having conductive threads closely spaced to form a junction connectable by an electronic component. Neither term is intended to define an orientation of the knit fabric relative to a device in which it is incorporated. For example, in some devices, the outer layer of the knit structure may face an external environment, while in other devices, the outer layer may face a device chassis or other internal structure.

Figure 2:
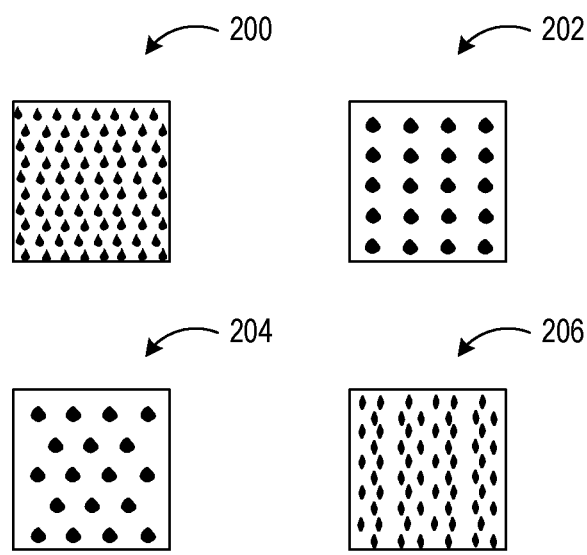
FIG. 2 shows example knitted pointelle patterns.

The surface texture features 106 may take any suitable form, including but not limited to the pointelles mentioned above. Other examples include lace, eyelets, and other openwork knit patterns. FIG. 2 schematically shows example pointelle patterns 200, 202, 204, and 206. The pointelles provide functional openings in an outer layer of the fabric to allow electronic components to be inserted and bonded to an inner layer of fabric within the openings. The pointelles also allow access to the electronic components, and may help to disguise the presence of the electronic components. The pattern of pointelles or knitted surface texture features used may depend on the desired locations for the electronic components within the textile, the sizes of the components, and/or other suitable factors.

Figure 3:
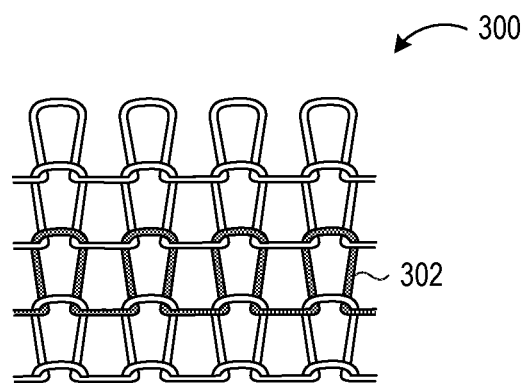
FIG. 3 schematically shows an example weft knitted structure.

As mentioned above, a knitted textile article having knitted surface texture features within an outer layer of the fabric structure and conductive threads within an inner layer may be knitted together in one pass. In some examples, such a knit structure may be weft knitted. In a weft knitted fabric, the stitches (loops of thread) run horizontally across the fabric. Weft knitting may be performed, for example, using a flatbed weft knitting machine. FIG. 3 schematically shows an example weft knit structure 300 having a conductive thread 302 knit with a plurality of non-conductive threads. A weft knitting machine may include a special carrier unit that allows inlaying of single threads or yarns, facilitating the introduction of conductive threads as desired to form conductive thread patterns. Example weft knitting machines include the SWG-N2 series available from Shima Seiki, Mfg., Ltd. of Wakayama, Japan, and the CMS series or ADF series machines available from H. Stoll AG & Co. KG of Reutlingen, Germany. Although described herein in the context of weft knitting, it will be understood that a knitted textile article may also be warp knitted, circularly knitted, etc. In other examples, weaving or embroidery may also be used along with knitting to form the textile article.

The conductive and non-conductive threads may comprise any suitable materials. For example, the non-conductive threads may comprise fabric fibers, such as wool, cotton, or synthetic fibers (e.g. nylon, polyester, acrylic, polyolefin, etc.). Likewise, the conductive threads may comprise a fabric fiber (e.g. nylon) coated with an electrically conductive material, such as copper, nickel, silver, gold, or other metallic materials, or may comprise pure metal wires without a core fabric fiber, as examples. The conductive metal may be uncoated or coated, e.g. with an insulating material. An insulating coating may allow knit insulating features to be omitted where the conductive threads cross one another. In some examples, a coating may be applied or used on one or both conductive threads only where conductive threads cross one another. In other examples, a coating may be removed to expose the underlying conductor only in junction regions and not in other regions.

Figure 4:
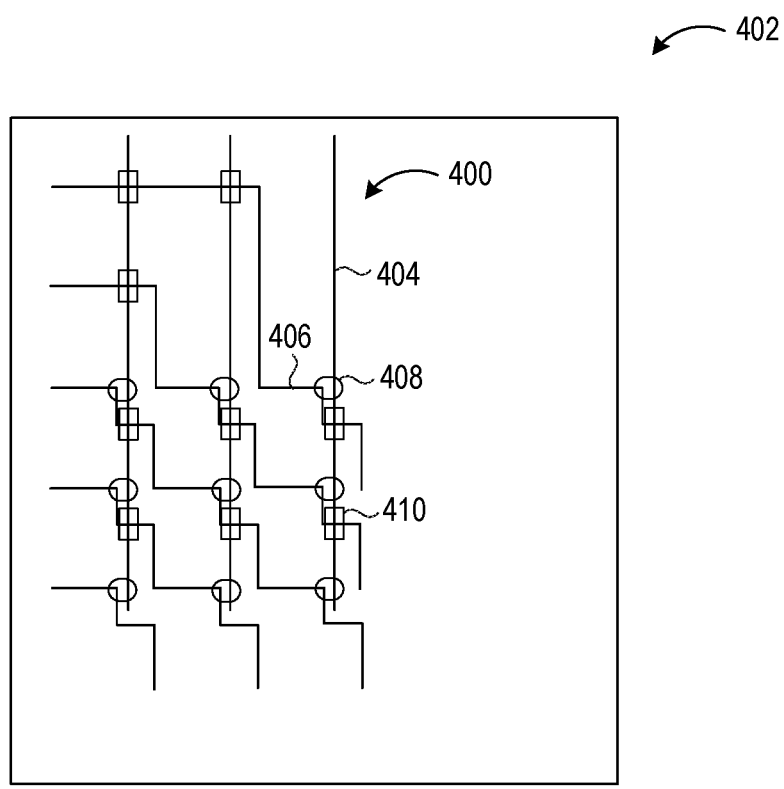
FIG. 4 shows an example conductive thread pattern formed in a knitted textile article.

FIG. 4 shows an example conductive thread pattern 400 on a knitted textile article 402. The vertical threads 404 and horizontally intersecting threads 406 represent conductive threads knit into the fabric to form the conductive thread pattern in an inner layer of a knitted textile article. The conductive threads 404 and 406 are arranged to run in generally parallel directions in regions in which electronic components are to be attached. In these regions, the conductive threads 404 and 406 are in close proximity but are separated by a gap to form individually indexable conductive junctions 408. The conductive junctions 408 correspond to areas of the conductive layer that align with openings (shown by elliptical outlines) defined by knitted surface texture features (e.g. pointelles) in an outer layer of the knit structure. Locations 410 at which two conductive threads cross include insulating features knit into the textile article as surface texture features in an inner layer of the knitted textile article. The insulating features, shown in more detail in FIGS. 5A-5B, allow one conductive thread to cross over the other conductive thread without shorting. As mentioned above, in other examples, the conductive threads may be coated with an insulating material. In such examples, the knit insulating features may be omitted. While FIG. 4 depicts two conductive threads in a junction region, other examples may have three or more conductive threads in a junction region, depending upon a number of terminals on a device to be mounted at a junction (e.g. a phototransistor junction may have three conductors).

Figure 5A:
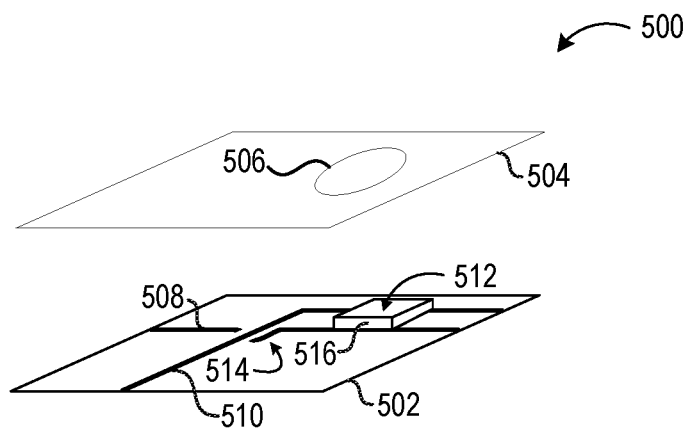
FIG. 5A schematically shows an exploded view of an example conductive junction formed in a knitted textile article.

FIG. 5A shows a schematic exploded view 500 of a portion of an example knitted textile article. The depicted knitted textile article includes a conductive layer 502 and an outer layer 504 having a knitted surface texture feature that defines an opening 506. The conductive layer 502 includes a first conductive thread 508 and a second conductive thread 510 that form a conductive junction 512 separated by a gap. Where the first conductive thread 508 and the second conductive thread 510 cross, an insulating feature 514, shown as an underlying, "float" segment of the fabric, is knit into the fabric, allowing the second conductive thread 510 to overlap the first conductive thread 508. An electronic component 516 is bonded to the conductive threads 508 and 510, bringing the gap of the conductive junction 512 to form a circuit. The opening 506 in the outer layer 504 is located such that the electronic component 516 may be accessible through the opening 506. Suitable electronic components include input devices (e.g. photodiodes, phototransistors, ionizing radiation sensors, audio sensors, thermal sensors, gas sensors, light sensors, acoustic sensors, galvanic skin response sensors), output devices, (e.g. speakers, haptic devices, other light emitters), and various circuit components (e.g. resistors, diodes, capacitors).

Figure 5B:
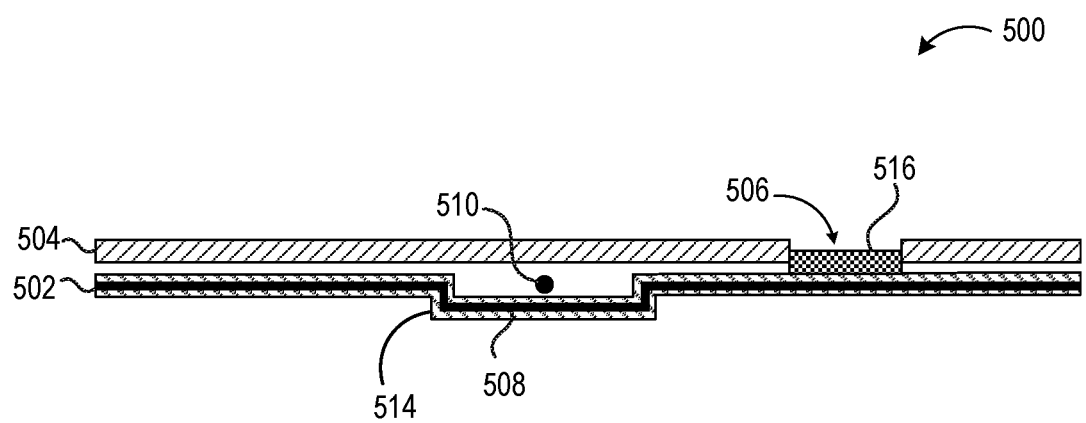
FIG. 5B schematically shows a cross-sectional view of the example conductive junction of the knitted textile article of FIG. 5A.

FIG. 5B schematically shows a cross-sectional side view of the example conductive junction in the knitted textile article of FIG. 5A. At the location where the insulating feature 514 is formed, the first conductive thread 508 includes a "float" region that extends underneath at that location without being knit into the rest of the structure. In other examples, a float layer incorporating the first conductive thread 508 may be formed using a double knitting technique. While FIGS. 5A and 5B schematically depict layers, in some examples the depicted layers are not made separately and then joined, but instead are formed in a same knitting process as a unified structure. For example, the conductive layer 502 and the outer layer 504 may be joined together at the edges via a selvage stitch. Further, in some examples, the outer and inner layers may be joined at various locations with a pick stitch, a stitch that periodically runs throughout the knit structure. Such a structure may be formed in a single knitting pass, for example, via a flat-bed weft knitting process.

Figure 7:
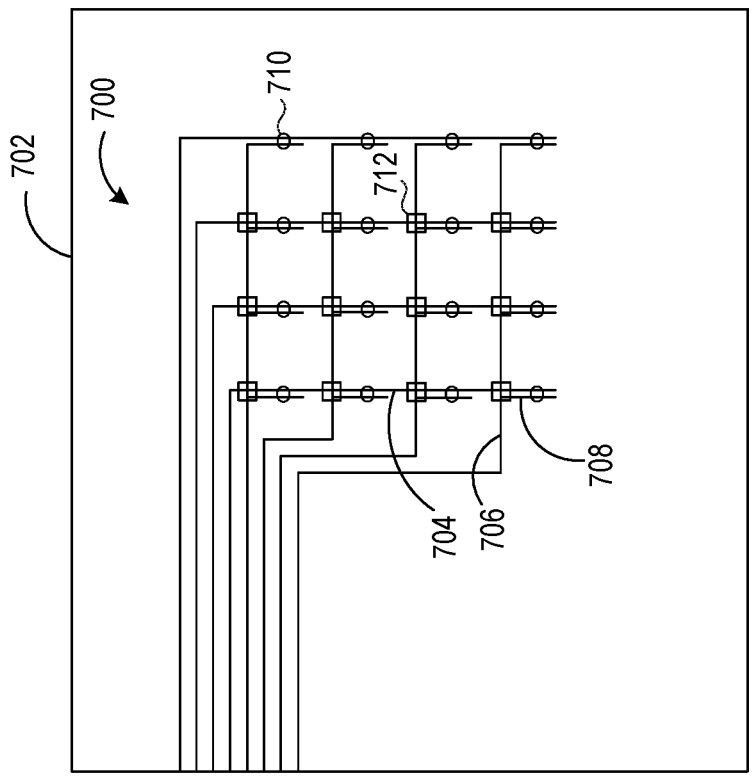
FIG. 7 shows yet another example conductive thread pattern formed in a knitted textile article.
Figure 6:
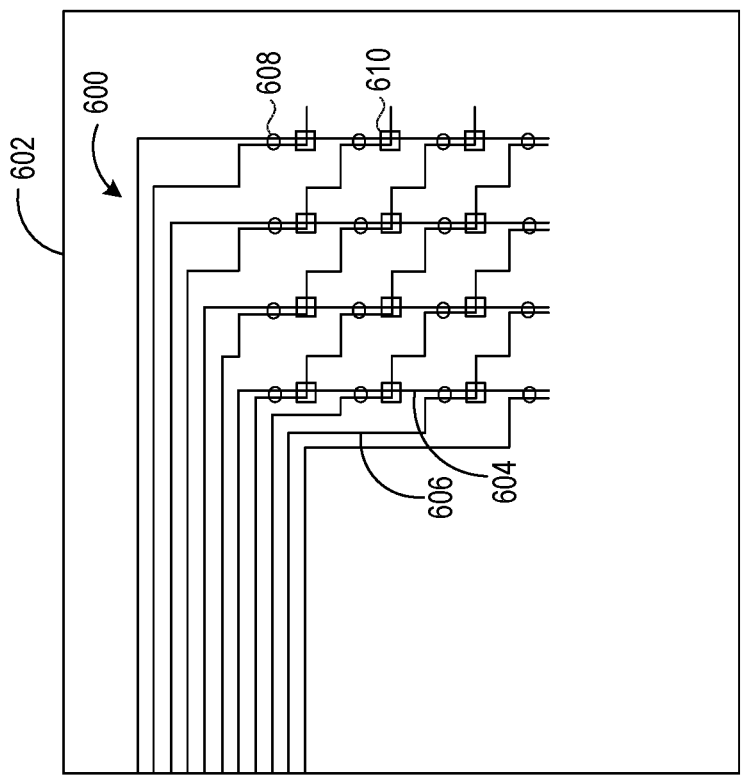
FIG. 6 shows another example conductive thread pattern formed in a knitted textile article.

FIG. 6 and FIG. 7 show additional examples of conductive thread patterns on a knitted textile article. Each of conductive thread pattern 600 and conductive thread pattern 700 has threads that reach all the way to the edge of the knitted textile article 602 and knitted textile article 702, respectively. Conductive thread pattern 600 includes threads running in a vertical direction, such as vertical thread 604, and threads running in horizontal and vertical directions in a stairstep manner, such as thread 606. Similar to FIG. 4, the conductive threads of FIG. 6 are arranged to run in generally parallel directions in regions in which electronic components are to be attached. In these regions, the conductive threads are in close proximity but are separated by a gap to form individually indexable conductive junctions 608. Conductive junctions 608 correspond to areas of the conductive layer that align with openings (shown by elliptical outlines) defined by knitted surface texture features in an outer layer of the knit structure. Conductive thread pattern 600 also includes locations 610 at which two conductive threads cross, which may include knit insulating features, as described above.

Conductive thread pattern 700 comprises vertical threads 704, and horizontal threads 706 that include smaller branching vertical threads 708 extending from the horizontal threads. Conductive thread pattern 700 also forms a plurality of individually indexable conductive junctions 710, which correspond to areas of the conductive layer that align with openings in an outer layer of the knit structure. Conductive thread pattern 700 also includes locations 712 at two conductive threads cross. As described above, these locations may include knit insulating features in some examples.

The conductive thread patterns of FIG. 4, FIG. 6 and FIG. 7 each form an array of individually indexable conductive junctions, which may be controlled via a controller (not shown). It will be understood that the conductive thread patterns are shown for example, and that any other suitable conductive thread patterns may be used. The conductive thread pattern used may be based on the type of knitting machine and/or knitting techniques used in some examples.

Figure 8:
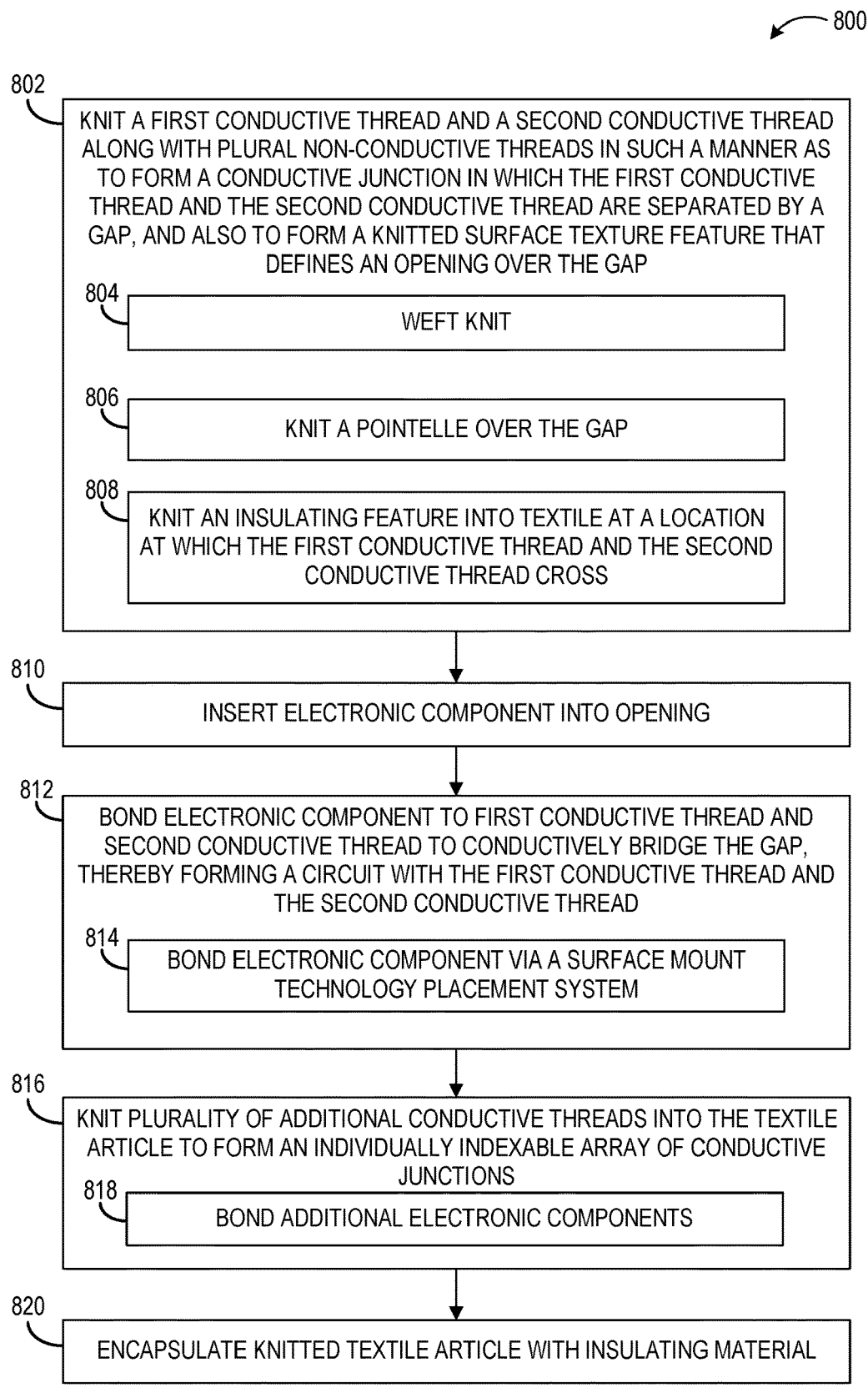
FIG. 8 shows an example method of forming a knitted textile article.

FIG. 8 shows an example method 800 of forming a knitted textile article. Method 800 includes, at 802, knitting a first conductive thread and a second conductive thread along with plural non-conductive threads to form a knitted article comprising a conductive junction and also a knitted surface texture feature. At the conductive junction, the first conductive thread and the second conductive thread are separated by a gap, and the knitted surface texture feature defines an opening over the gap. As described above, the conductive threads may be on an inner layer of the textile while the surface texture features may be on an outer layer, where the inner and outer layers are formed in a same knitting pass. Any suitable knitting technique may be used. In some example, knitting the textile article may include weft knitting, at 804. In other examples, warp knitting or circular knitting may be used. Where the textile is weft knitted, a flatbed weft knitting machine may be used.

As mentioned above, a knitted surface texture feature may be any suitable knit feature that defines an opening in the fabric. In some examples, the knitted surface texture feature may comprise a pointelle, as shown at 806. In other examples, the knitted surface texture feature may comprise a lace opening, an eyelet, or other suitable openwork knitting feature. The opening defined by the surface texture feature may be of a suitable size to allow an electronic component to be placed within the opening, and/or to allow for a desired functionality of the device (e.g. a narrower or wider opening may be used based upon a range of angles from which a full brightness of emitted light is desired to be viewable).

Also as mentioned above, insulating features may be knit into the textile to allow one conductive trace to cross another without shorting. As such, method 800 includes, at 808, knitting an insulating feature into the textile at a location at which the first conductive thread and the second conductive thread cross. The insulating feature may be knit as a surface texture feature in an inner layer of the knitted textile article.

In other examples, conductive threads coated with an insulating layer may be used, instead of the knit insulating features.

Method 800 further includes, at 810, inserting an electronic component into the opening defined by the knit surface texture feature. In some examples, a light-emissive semiconductor die (e.g. an unpackaged light-emitting diode) may be used. Other examples include input devices (e.g. photodiodes, phototransistors, ionizing radiation sensors, audio sensors, thermal sensors, gas sensors, light sensors, acoustic sensors, and/or galvanic skin response sensors), output devices, (e.g. speakers, haptic devices, other light emitters), and various circuit components (e.g. resistors, diodes, capacitors, etc.). Method 800 further includes, at 812, bonding the electronic component to the first conductive thread and the second conductive thread to connect the gap, thereby forming a circuit with the first conductive thread and the second conductive thread. The electronic component may be bonded to the conductive circuitry in any suitable manner, such as via soldering or a conductive adhesive (comprising, for example, conductive particles, such as silver or carbon) in a curable polymer matrix, e.g. urethane, acrylate, or polysiloxane). The electronic component may be bonded via a surface mount technology placement system (e.g. a pick-and-place machine), at 814, or in any other suitable manner.

A plurality of conductive threads may be knit into the textile article to form an individually indexable array of conductive junctions, at 816. One or more of these additional conductive junctions in the array may also include bonded electronic components, at 818, to form a desired configuration of individually addressable electronic components. Optionally, method 800 includes encapsulating the knitted textile article with an insulating material, such as a clear polymer (e.g. polyurethane or other laminate. An encapsulant layer may help protect the conductive threads and electronic components from damage, moisture, shorting out, etc.

It will be understood that a knitted textile article as disclosed herein may be incorporated into any suitable electronic product utilizing fabric, such as fabric-covered or fabric-backed electronic devices (e.g. computers, laptops, tablet computers, mobile phones), wearable devices (e.g. clothing, accessories, head-mounted devices), devices arranged in fabric items (e.g. furniture), clothing articles, etc.

In some embodiments, control of an electronic knitted textile article as described herein may be tied to a computing system of one or more computing devices. In particular, such control processes may be implemented as a computer-application program or service, an application-programming interface (API), a library, and/or other computer-program product.

Figure 9:
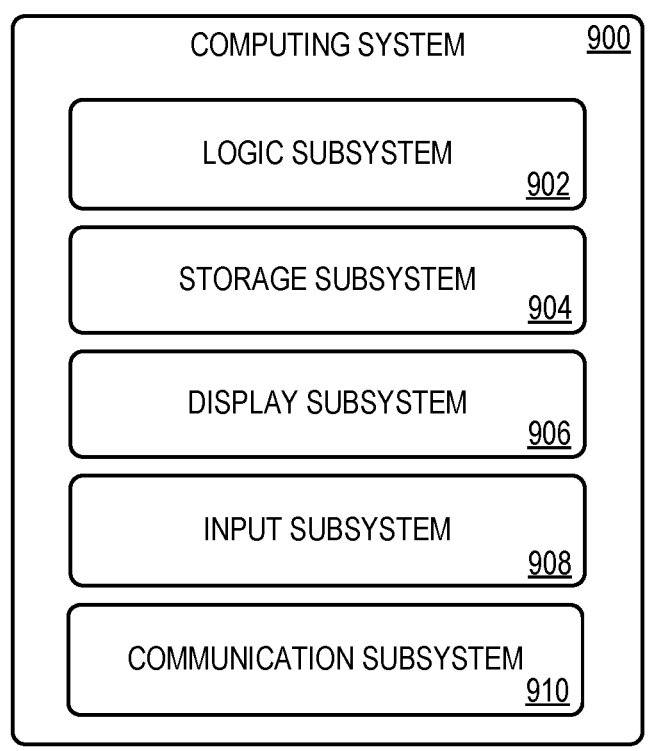
FIG. 9 shows a block diagram of an example computing system.

FIG. 9 schematically shows an example computing system 900 that can control an array of individually addressable electronic components within an electronic knitted textile article, or receive input from a similar array of input devices, as described above. Computing system 900 is shown in simplified form. Computing system 900 may take the form of one or more personal computers, server computers, laptop computers, tablet computers, home-entertainment computers, network computing devices, gaming devices, mobile computing devices, mobile communication devices (e.g., smart phone), handheld computing devices, wearable computing devices (e.g. head-mounted display device), and/or other computing devices. Computing system 900 may incorporate fabric material, fabric components, fabric surfaces, or itself be incorporated within a fabric product.

Computing system 900 includes a logic subsystem 902 and a storage subsystem 904. Computing system 900 may optionally include a display subsystem 906, input subsystem 908, communication subsystem 910, and/or other components not shown in FIG. 9.

Logic subsystem 902 includes one or more physical devices configured to execute instructions. For example, the logic subsystem 902 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem 902 may include one or more processors configured to execute software instructions. Additionally or alternatively, the logic subsystem 902 may include one or more hardware or firmware logic machines configured to execute hardware or firmware instructions. Processors of the logic subsystem 902 may be single-core or multi-core, and the instructions executed thereon may be configured for sequential, parallel, and/or distributed processing. Individual components of the logic subsystem 902 optionally may be distributed among two or more separate devices, which may be remotely located and/or configured for coordinated processing. Aspects of the logic machine may be virtualized and executed by remotely accessible, networked computing devices configured in a cloud-computing configuration.

Storage subsystem 904 includes one or more physical devices configured to hold instructions executable by the logic subsystem 902 to implement various methods and processes of the computing system 900. For example, instructions may be stored which are executable to control an array of individually addressable electronic components in an electronic knitted textile article, as disclosed herein. When such methods and processes are implemented, the state of storage subsystem 904 may be transformed—e.g., to hold different data.

Storage subsystem 904 may include removable and/or built-in devices. Storage subsystem 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 904 may include volatile, nonvolatile, dynamic, static, read/write, read-only, random-access, sequential-access, location-addressable, file-addressable, and/or content-addressable devices.

It will be appreciated that storage subsystem 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 902 and storage subsystem 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 906 may be used to present a visual representation of data held by storage subsystem 904. This visual representation may take the form of a graphical user interface (GUI). As the herein described methods and processes change the data held by the storage machine, and thus transform the state of the storage machine, the state of display subsystem 906 may likewise be transformed to visually represent changes in the underlying data. Display subsystem 906 may include one or more display devices utilizing virtually any type of technology. Such display devices may be combined with logic subsystem 902 and/or storage subsystem 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

Another example provides a knitted textile article, including a first conductive thread and a second conductive thread knit into the article in such a manner as to form a conductive junction separated by a gap, a knitted surface texture feature formed at a location that defines an opening over the gap, and an electronic component connecting the gap to form a circuit with the first conductive thread and the second conductive thread. The knitted surface texture may additionally or alternatively include a pointelle. The knitted textile article may additionally or alternatively include an insulating feature knit into the textile article at a location at which the first conductive thread and the second conductive thread cross. The electronic component may additionally or alternatively include a light-emitting diode. The electronic component may additionally or alternatively include one or more of a photodiode, phototransistor, ionizing radiation sensor, audio sensor, thermal sensor, gas sensor, light sensor, acoustic sensor, galvanic skin response sensor, speaker, and haptic device. The first conductive thread and the second conductive thread may additionally or alternatively include uncoated metallic conductive threads. The knitted textile article may additionally or alternatively include a plurality of additional conductive threads knit into the article to form an individually indexable array of conductive junctions. The knitted textile article may additionally or alternatively include a weft-knit article.

Another example provides a method of forming a knitted textile article, the method including knitting a first conductive thread and a second conductive thread along with plural non-conductive threads in such a manner as to form a conductive junction in which the first conductive thread and the second conductive thread are separated by a gap and also to form a knitted surface texture feature that defines an opening over the gap, inserting an electronic component into the opening, and bonding the electronic component to the first conductive thread and the second conductive thread to connect the gap, thereby forming a circuit with the first conductive thread and the second conductive thread. Knitting the first conductive thread and the second conductive thread into the article may additionally or alternatively include weft knitting. Knitting the first conductive thread and the second conductive thread to form the knitted surface texture feature may additionally or alternatively include knitting a pointelle over the gap. Bonding the electronic component may additionally or alternatively include bonding via a surface mount technology placement system. The electronic component may additionally or alternatively include one or more of a light-emitting diode, a thermal sensor, a gas sensor, a light sensor, an acoustic sensor, and a galvanic skin response sensor. The method may additionally or alternatively include knitting an insulating feature into the textile article at a location at which the first conductive thread and the second conductive thread cross to prevent shorting of the first conductive thread and the second conductive thread.

Another example provides an electronic device, comprising a surface comprising a knitted textile article, the knitted textile article comprising a plurality of conductive threads knitted into the article in such a pattern as to form a plurality of individually addressable conductive junctions, each conductive junction separated by a corresponding gap, and for each of one or more individually addressable conductive junctions, a knitted surface texture feature formed at a location that defines an opening over the gap, and an electronic component connecting the gap to form a circuit with the first conductive thread and the second conductive thread. The knitted surface texture feature may additionally or alternatively include a pointelle or similar surface texture feature. The electronic device may additionally or alternatively include an insulating feature knit into the textile article at a location at which a first conductive thread and a second conductive thread cross. The electronic component may additionally or alternatively include one or more of a light-emitting diode, a thermal sensor, a gas sensor, a light sensor, an acoustic sensor, and a galvanic skin response sensor. One or more of the plurality of conductive threads may additionally or alternatively include uncoated metallic conductive threads. The knitted textile article may additionally or alternatively include a weft-knit article.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A knitted textile article, comprising:
   a plurality of nonconductive knit threads that form an outer layer and an inner layer, the outer layer comprising a knitted surface texture feature forming an opening in the outer layer, and the outer layer and the inner layer being knit together as a whole fabric structure;
   a first conductive thread and a second conductive thread knit into the inner layer of the knitted textile article in such a manner as to be proximate to the opening formed by the knitted surface texture feature, the first and second conductive threads being separate except where connected by one or more electronic components; and
   an electronic component of the one or more electronic components positioned within the knitted surface texture feature, the electronic component of the one or more electronic components connecting the first conductive thread and the second conductive thread to form a circuit.

2. The knitted textile article of claim 1, wherein the knitted surface texture feature comprises a pointelle.

3. The knitted textile article of claim 1, further comprising an insulating feature knit into the textile article at a location at which the first conductive thread and the second conductive thread cross.

4. The knitted textile article of claim 1, wherein the electronic component comprises a light-emitting diode.

5. The knitted textile article of claim 1, wherein the electronic component comprises one or more of a photodiode, phototransistor, ionizing radiation sensor, audio sensor, thermal sensor, gas sensor, light sensor, acoustic sensor, galvanic skin response sensor, speaker, and haptic device.

6. The knitted textile article of claim 1, wherein the first conductive thread and the second conductive thread comprise uncoated metallic conductive threads.

7. The knitted textile article of claim 1, further comprising a plurality of additional conductive threads knit into the article to form an individually indexable array of conductive junctions.

8. The knitted textile article of claim 1, wherein the knitted textile article comprises a weft-knit article.

9. An electronic device, comprising:
   a fabric covering comprising
      a plurality of nonconductive knit threads that form an outer layer and an inner layer, the outer layer comprising a plurality of knitted surface texture features each forming an opening in the outer layer, and the outer layer and the inner layer being knit together as a whole fabric structure;
      a plurality of conductive threads knitted into the inner layer such that a first conductive thread and a second conductive thread are proximate to an opening formed by one of the plurality of knitted surface texture features, the first and second conductive threads being separate except where connected by one or more electronic components; and
      an electronic component of the one or more electronic components positioned within the opening and connecting the first conductive thread and the second conductive thread to form an individually addressable conductive junction.

10. The electronic device of claim 9, wherein a knitted surface texture feature of the plurality of knitted surface texture feature comprises a pointelle or similar surface texture feature.

11. The electronic device of claim 9, further comprising an insulating feature knit into the textile article at a location at which the first conductive thread and the second conductive thread cross.

12. The electronic device of claim 9, wherein the electronic component comprises one or more of a light-emitting diode, a thermal sensor, a gas sensor, a light sensor, an acoustic sensor, and a galvanic skin response sensor.

13. The electronic device of claim 9, wherein one or more of the plurality of conductive threads comprise uncoated metallic conductive threads.

14. The electronic device of claim 9, wherein the fabric covering is weft-knit.

* * * * *